United States Patent
Cheng

(10) Patent No.: US 10,937,849 B2
(45) Date of Patent: Mar. 2, 2021

(54) ARRAY SUBSTRATE AND METHOD OF MANUFACTURING THE SAME, DISPLAY PANEL AND DISPLAY DEVICE

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/453,534

(22) Filed: Jun. 26, 2019

(65) Prior Publication Data

US 2020/0035773 A1 Jan. 30, 2020

(30) Foreign Application Priority Data

Jul. 24, 2018 (CN) .......................... 201810821595.5

(51) Int. Cl.
*H01L 27/32* (2006.01)
*H01L 27/02* (2006.01)

(52) U.S. Cl.
CPC ...... *H01L 27/3272* (2013.01); *H01L 27/0296* (2013.01); *H01L 27/3246* (2013.01); *H01L 27/3258* (2013.01); *H01L 27/3276* (2013.01); *H01L 2227/323* (2013.01)

(58) Field of Classification Search
CPC ............ H01L 27/3272; H01L 27/0296; H01L 27/3246; H01L 27/3258; H01L 27/3276; H01L 27/0288; H01L 27/124; H01L 27/3244; H01L 2227/323
See application file for complete search history.

(56) References Cited

U.S. PATENT DOCUMENTS

| | | |
|---|---|---|
| 2018/0032189 A1 | 2/2018 | Lee et al. |
| 2018/0151838 A1 | 5/2018 | Park et al. |
| 2019/0148290 A1* | 5/2019 | Ku ...................... H01L 23/5384 257/774 |

FOREIGN PATENT DOCUMENTS

| | | |
|---|---|---|
| CN | 205427390 U | 8/2016 |
| CN | 107665911 A | 2/2018 |
| CN | 108123062 A | 6/2018 |

OTHER PUBLICATIONS

First Office Action issued in corresponding Chinese Application No. 201810821595.5, dated Mar. 26, 2020, with English translation.

* cited by examiner

*Primary Examiner* — Robert T Huber
*Assistant Examiner* — Gardner W. S. Swan
(74) *Attorney, Agent, or Firm* — McDermott Will & Emery LLP

(57) ABSTRACT

An array substrate has a display area and a non-display area disposed at a periphery of the display area. The array substrate includes: a base substrate; at least one gate driver on array (GOA) circuit disposed on the base substrate and disposed in the non-display area; a planarization layer disposed on a side of the at least one GOA circuit facing away from the base substrate; and at least one electrostatic protection portion disposed on a surface of the planarization layer facing away from the base substrate and disposed in the non-display area. An orthographic projection of each GOA circuit on the base substrate is located within an outer boundary of an orthographic projection of a corresponding electrostatic protection portion on the base substrate.

6 Claims, 9 Drawing Sheets

ARRAY SUBSTRATE AND METHOD OF MANUFACTURING THE SAME, DISPLAY PANEL AND DISPLAY DEVICE

CROSS-REFERENCE TO RELATED APPLICATION

This application claims priority to Chinese Patent Application No. 201810821595.5, filed with the Chinese Patent Office on Jul. 24, 2018, titled "ARRAY SUBSTRATE AND METHOD OF MANUFACTURING THE SAME, DISPLAY PANEL AND DISPLAY DEVICE", which is incorporated herein by reference in its entirety.

TECHNICAL FIELD

The present disclosure relates to the field of display technologies, and in particular, to an array substrate and a method of manufacturing the same, a display panel and a display device.

BACKGROUND

Organic light-emitting diodes (abbreviated as OLEDs), especially active-matrix organic light-emitting diodes (abbreviated as AMOLEDs), have been widely used in the display field due to their advantages of high luminance, full viewing angle, fast response and flexible display.

SUMMARY

In one aspect, an array substrate is provided. The array substrate has a display area and a non-display area disposed at a periphery of the display area. The array substrate includes: a base substrate; at least one gate driver on array (GOA) circuit disposed on the base substrate and disposed in the non-display area; a planarization layer disposed on a side of the at least one GOA circuit facing away from the base substrate; and at least one electrostatic protection portion disposed on a surface of the planarization layer facing away from the base substrate and disposed in the non-display area. An orthographic projection of each GOA circuit on the base substrate is located within an outer boundary of an orthographic projection of a corresponding electrostatic protection portion on the base substrate.

In some embodiments, each electrostatic protection portion includes at least one opening.

In some embodiments, the array substrate further includes OLEDs disposed on the surface of the planarization layer facing away from the base substrate. The OLEDs are disposed in the display area and are arranged in an array. Each OLED includes: an anode and a cathode disposed opposite to each other; and a light-emitting layer disposed between the anode and the cathode. The at least one electrostatic protection portion and anodes of the OLEDs are disposed in a same layer.

In some embodiments, the array substrate further includes at least one cathode wire disposed at a side of the planarization layer close to the base substrate. The at least one cathode wire is disposed in the non-display area. An orthographic projection of the at least one electrostatic protection portion on the base substrate is located outside an orthographic projection of the at least one cathode wire on the base substrate. A portion of the planarization layer directly opposite each cathode wire is provided with at least one first via hole, and cathodes of the OLEDs are coupled to the cathode wire through the at least one first via hole.

In some embodiments, the array substrate further includes a pixel defining layer disposed between the electrostatic protection portion and the cathodes of the plurality of OLEDs. The orthographic projection of the at least one electrostatic protection portion on the base substrate is located within an outer boundary of an orthographic projection of the pixel defining layer on the base substrate, and the orthographic projection of the at least one cathode wire on the base substrate is located outside the outer boundary of the orthographic projection of the pixel defining layer on the base substrate. A portion of the pixel defining layer directly opposite each electrostatic protection portion is provided with at least one second via hole, and the cathodes of the OLEDs are also coupled to the electrostatic protection portion through the at least one second via hole.

In some embodiments, the array substrate further includes at least one cathode wire disposed at a side of the planarization layer close to the base substrate. The at least one cathode wire is disposed in the non-display area. Cathodes of the OLEDs are coupled to each cathode wire through a corresponding electrostatic protection portion.

In some embodiments, each electrostatic protection portion includes at least one opening. The cathodes of the OLEDs are coupled to the electrostatic protection portion, and an orthographic projection of a portion of the cathodes, which is in contact with the electrostatic protection portion, on the base substrate is located outside an orthographic projection of the at least one opening on the base substrate.

In some embodiments, each electrostatic protection portion includes at least one first connecting portion and at least one second connecting portion connected to the at least one first connecting portion. The at least one first connecting portion is coupled to the cathodes of the OLEDs, and each second connecting portion is coupled to a corresponding cathode wire. In some examples, an orthographic projection of the at least one first connecting portion on the base substrate at least partially coincides with an orthographic projection of the at least one second connecting portion on the base substrate. In some other examples, the orthographic projection of the at least one first connecting portion on the base substrate is located outside the orthographic projection of the at least one second connecting portion on the base substrate.

In some embodiments, a portion of the planarization layer directly opposite each second connecting portion is provided with at least one third via hole, and the second connecting portion is coupled to a corresponding cathode wire through the at least one third via hole.

In some embodiments, the array substrate further includes a pixel defining layer disposed between the at least one electrostatic protection portion and cathodes of the OLEDs. A portion of the pixel defining layer directly opposite each first connecting portion is provided with at least one fourth via hole, and the cathodes of the OLEDs are coupled to the first connecting portion through the at least one fourth via hole.

In some embodiments, the orthographic projection of the at least one first connecting portion on the base substrate is located outside the orthographic projection of the at least one second connecting portion on the base substrate. The orthographic projection of the at least one second connecting portion on the base substrate is located within an outer boundary of an orthographic projection of the pixel defining layer on the base substrate, and a portion of the pixel defining layer directly opposite each second connecting portion is provided with at least one fifth via hole. The cathodes of the OLEDs are also coupled to the second connecting portion through the at least one fifth via hole.

In some embodiments, the orthographic projection of the at least one first connecting portion on the base substrate is located outside the orthographic projection of the at least one second connecting portion on the base substrate, and the orthographic projection of the at least one second connecting portion on the base substrate is substantially located outside an orthographic projection of the pixel defining layer on the base substrate. The the cathodes of the OLEDs are also directly coupled to the at least one second connecting portion.

In another aspect, a method of manufacturing the array substrate according to the above aspect is provided. The array substrate has a display area and a non-display area disposed at a periphery of the display area. The manufacturing method includes: providing a base substrate; forming at least one gate driver on array (GOA) circuit on the base substrate, wherein the at least one GOA circuit is disposed in the non-display area; forming a planarization layer on a side of the at least one GOA circuit facing away from the base substrate; and forming at least one electrostatic protection portion on a surface of the planarization layer facing away from the base substrate, wherein an orthographic projection of each GOA circuit on the base substrate is located within an outer boundary of an orthographic projection of a corresponding electrostatic protection portion on the base substrate.

In some embodiments, the method of manufacturing the array substrate further includes: forming at least one opening in each electrostatic protection portion.

In some embodiments, forming at least one electrostatic protection portion on the surface of the planarization layer facing away from the base substrate, includes: forming a first electrode layer on the surface of the planarization layer facing away from the base substrate; and patterning the first electrode layer, so that portions of the first electrode layer located in the display area form anodes of OLEDs arranged in an array, and a portion of the first electrode layer located in the non-display area forms the at least one electrostatic protection portion.

In some embodiments, before forming the planarization layer on the side of the at least one GOA circuit facing away from the base substrate, the method further includes: forming at least one cathode wire at a side of the base substrate at which the at least one GOA circuit is formed, wherein the at least one cathode wire is disposed in the non-display area. Forming the planarization layer on the side of the at least one GOA circuit facing away from the base substrate, includes: forming the planarization layer on a side of the at least one GOA circuit and the at least one cathode wire facing away from the base substrate; and forming at least one first via hole in a portion of the planarization layer directly opposite each cathode wire, wherein an orthographic projection of the at least one first via hole on the base substrate is located outside the orthographic projection of a corresponding electrostatic protection portion on the base substrate. The method of manufacturing the array substrate further includes: forming a pixel defining layer on a surface of the at least one electrostatic protection portion facing away from the base substrate, surfaces of anodes of the OLEDs facing away from the base substrate and a surface of the planarization layer not covered by the at least one electrostatic protection portion and the anodes of the OLEDs, wherein an orthographic projection of the pixel defining layer on the base substrate is located outside the orthographic projection of the at least one first via hole on the base substrate; and forming openings in portions of the pixel defining layer directly opposite the anodes of the OLEDs respectively, and forming a light-emitting layer of an OLED in each opening; and forming a second electrode layer on a surface of the pixel defining layer facing away from the base substrate and surfaces of light-emitting layers of the OLEDs facing away from the base substrate and in the at least one first via hole, wherein the second electrode layer includes cathodes of the OLEDs, and a portion of the second electrode layer located in the at least one first via hole is coupled to the cathode wire.

In some embodiments, the method of manufacturing the array substrate further includes: forming at least one second via hole in a portion of the pixel defining layer directly opposite each electrostatic protection portion. Forming the second electrode layer, further includes: forming the second electrode layer in the at least one second via hole, wherein a portion of the second electrode layer located in the at least one second via hole is coupled to a corresponding electrostatic protection portion.

In some embodiments, before forming the planarization layer on the side of the at least one GOA circuit facing away from the base substrate, the method further includes: forming at least one cathode wire at a side of the base substrate at which the at least one GOA circuit is formed, wherein the at least one cathode wire is disposed in the non-display area. Forming the planarization layer on the side of the at least one GOA circuit facing away from the base substrate, includes: forming the planarization layer on a side of the at least one GOA circuit and the at least one cathode facing away from the base substrate; and forming at least one third via hole in a portion of the planarization layer directly opposite each cathode wire, wherein a portion of the electrostatic protection portion is coupled to the cathode wire through the at least one third via hole. The method of manufacturing the array substrate further includes: forming a pixel defining layer on a surface of the at least one electrostatic protection portion facing away from the base substrate, surfaces of anodes of the OLEDs facing away from the base substrate and a surface of the planarization layer not covered by the at least one electrostatic protection portion and the anodes of the OLEDs; forming openings in portions of the pixel defining layer directly opposite the anodes of the OLEDs respectively, and forming at least one fourth via hole in a portion of the pixel defining layer directly opposite each electrostatic protection portion; forming a light-emitting layer of an OLED in each opening; and forming a second electrode layer on a surface of the pixel defining layer facing away from the base substrate and surfaces of light-emitting layers of the OLEDs facing away from the base substrate and in the at least one fourth via hole, wherein the second electrode layer includes cathodes of the OLEDs, and a portion of the second electrode layer located in the at least one fourth via hole is coupled to the electrostatic protection portion In yet another aspect, a display panel including the array substrate described above is provided.

In yet another aspect, a display panel including the display panel described above is provided.

BRIEF DESCRIPTION OF THE DRAWINGS

The accompanying drawings described herein are intended to provide a further understanding of some embodiments of the present disclosure and constitute a part of embodiments of the present disclosure. The illustrative embodiments of the present disclosure and the description thereof serve to explain the present disclosure, but do not constitute an undue limitation of the present disclosure. In the accompanying drawings.

DETAILED DESCRIPTION

For ease of understanding, an array substrate and a method of manufacturing the same, a display panel and a display device provided by some embodiments of the present disclosure will be described in detail below with reference to the accompanying drawings.

Currently, in an active-matrix organic light-emitting diode (AMOLED) display panel, an array substrate usually includes a plurality of pixels in a display area, and the plurality of pixel are arranged in an array. Pixels in a same row share a single gate line, and pixels in a same column share a single data line. Each pixel includes an OLED and a pixel driving circuit coupled to an anode of the OLED, and a schematic circuit diagram of the pixel driving circuit is shown in FIG. 1.

Figure 1:
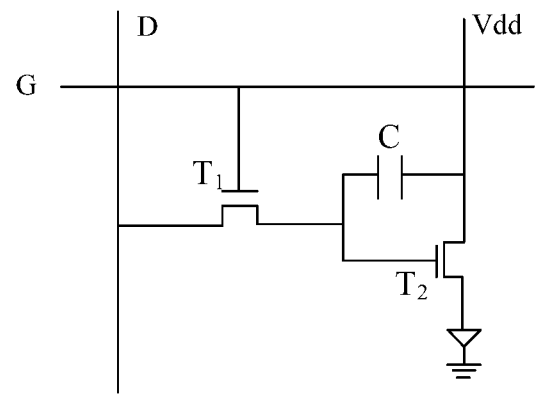
FIG. 1 is a schematic diagram of a pixel driving circuit of an array substrate in the related art.

With reference to FIG. 1, each pixel driving circuit includes a switching thin film transistor $T_1$, a driving thin film transistor $T_2$ and a storage capacitor C. A gate of the switching thin film transistor $T_1$ is coupled to a gate line G, a source of the switching thin film transistor $T_1$ is coupled to a data line D, and a drain of the switching thin film transistor $T_1$ is coupled to a gate of the driving thin film transistor $T_2$ and a first electrode of the storage capacitor C. A source of the driving thin film transistor $T_2$ is coupled to a second electrode of the storage capacitor C and a power line Vdd, and a drain of the driving thin film transistor $T_2$ is coupled to an anode of a corresponding OLED.

Pixel driving circuits of the plurality of pixels described above are coupled to at least one gate driver on array (GOA) circuit disposed in a non-display area of the array substrate, and may drive corresponding OLEDs to emit light under control of the at least one GOA circuit. Since structures of the pixel driving circuits and the at least one GOA circuit are relatively complicated, a side of the pixel driving circuits and the at least one GOA circuit facing away from the base substrate is usually provided with a planarization layer having a large thickness. Thus, it may be ensured that OLEDs of the plurality of pixels in the array substrate are disposed on a same flat surface.

However, since the structure of each GOA circuit is relatively complicated, and various other peripheral signal lines such as data line leads, gate line leads and a power lead are provided in the non-display area of the array substrate, after the at least one GOA circuit is miniaturized and integrated in the non-display area of the array substrate, the at least one GOA circuit is prone to an electrostatic damage, thereby resulting in a fatal failure or a potential failure of the at least one GOA circuit.

Figure 2:
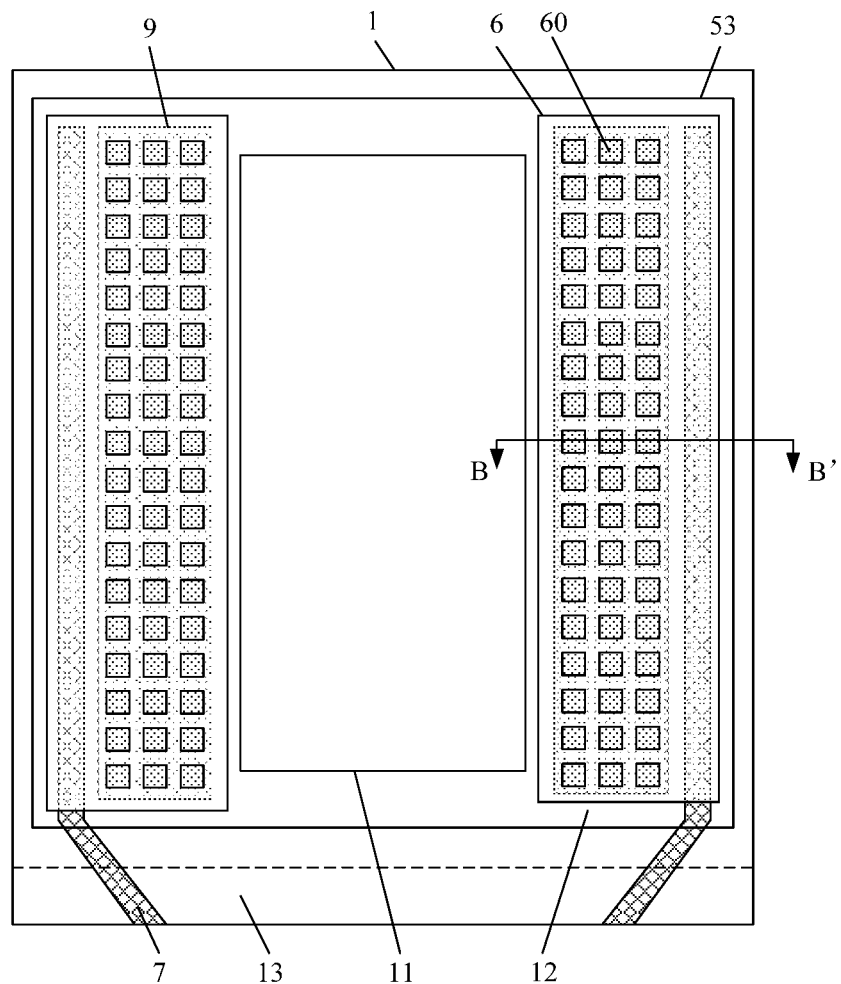
FIG. 2 is a schematic diagram showing a structure of an array substrate, in accordance with some embodiments.
Figure 3:
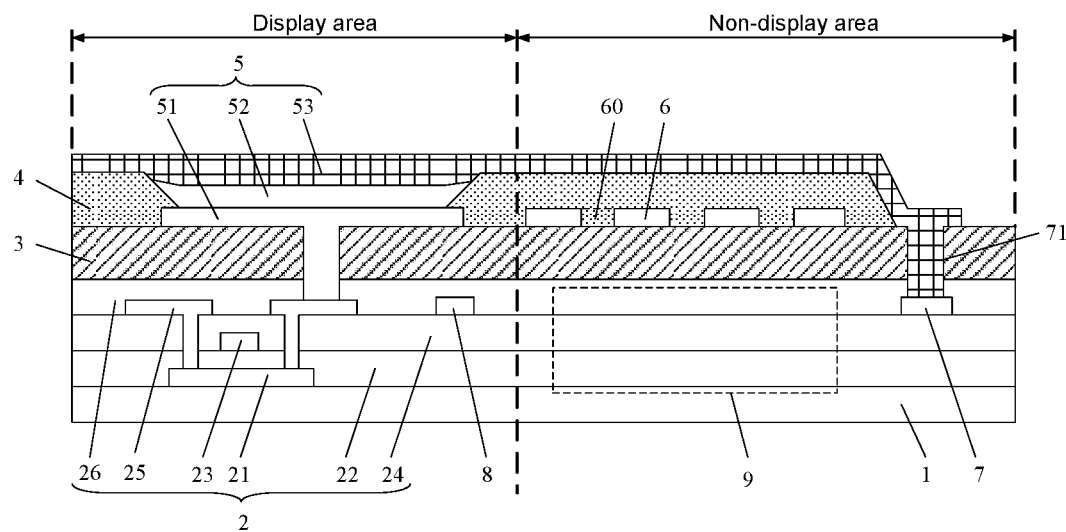
FIG. 3 is a cross-sectional diagram of an array substrate taken along line B-B', in accordance with some embodiments.

Based on this, some embodiments of the present disclosure provide an array substrate. With reference to FIGS. 2-9, the array substrate has a display area 11 and a non-display area 12 disposed at a periphery of the display area 11. The array substrate includes a base substrate 1, at least one gate driver on array circuit (i.e., at least one GOA circuit) 9, a planarization layer 3 and at least one electrostatic protection portion 6. The at least one GOA circuit 9 is disposed in the non-display area 12 and disposed on the base substrate 1 (for example, as shown in FIG. 3, the GOA circuit 9 is disposed on the upper side of the base substrate 1). The planarization layer 3 is disposed on a side of the at least one GOA circuit 9 facing away from the base substrate 1. The at least one electrostatic protection portion 6 is disposed in the non-display area 12 and disposed on a surface of the planarization layer 3 facing away from the base substrate 1. An orthographic projection of each GOA circuit 9 on the base substrate 1 is located within an outer boundary of an orthographic projection of a corresponding electrostatic protection portion 6 on the base substrate 1.

In some embodiments, the at least one GOA circuit 9 includes a single GOA circuit 9, which is disposed at a side of the display area 11. Correspondingly, the at least one electrostatic protection portion 6 includes a single electrostatic protection portion 6. In some other embodiments, as shown in FIG. 2, the at least one GOA circuit 9 includes two GOA circuits 9, which are disposed at opposite sides of the display area 11. Correspondingly, the at least one electrostatic protection portion 6 includes one or two electrostatic protection portions 6. In some other embodiments, the at least one GOA 9 includes more than two GOA circuits 9, and the arrangement of these GOA circuits 9 can be set according to actual needs. Correspondingly, the at least one electrostatic protection portion 6 includes one or more electrostatic protection portions 6. For simplicity, the following embodiments are described by taking an example in which one GOA circuit 9 corresponds to one electrostatic protection portion 6.

The at least one electrostatic protection portion 6 is made of a material capable of preventing an accumulation of static electricity (for example, a material capable of preventing a generation of the static electricity, or a material capable of conducting electric charges). In some examples, the at least one electrostatic protection portion 6 is made of a conductive material, such as a conductive metal. In this way, the GOA circuit 9 may be protected by a corresponding electrostatic protection portion 6 against the static electricity, thereby preventing the electrostatic damage of the GOA circuit 9 and ensuring a reliability of the array substrate.

In some embodiments, the planarization layer 3 is made of an organic resin material.

In some embodiments, as shown in FIG. 2-9, each electrostatic protection portion 6 includes at least one opening 60. In this way, in a case where some organic substances, such as organic solvents or small molecular materials, in the planarization layer 3 are easily volatilized when heated in subsequent processes of manufacturing the array substrate, which results in an outgassing of the planarization layer, the at least one opening 60 in the electrostatic protection portion 6 may be used to ensure that the organic substances are easily volatilized in a drying process or other subsequent processes of manufacturing the array substrate, thereby preventing bubbles from accumulating on a surface of the electrostatic protection portion 6 facing the planarization layer 3, which is advantageous for ensuring a process yield of the array substrate, thereby ensuring a good display effect of the array substrate.

In some examples, as shown in FIG. 2, the at least one opening 60 includes a plurality of openings 60, and the plurality of openings 60 are arranged in an array. Shapes, areas and distribution densities of the plurality of openings 60 may be set according to actual needs, which some embodiments of the present disclosure do not limit.

The array substrate is, for example, an OLED substrate, and as shown in FIGS. 3-9, the OLED array substrate further includes OLEDs 5 disposed on the surface of the planarization layer 3 facing away from the base substrate 1. The OLEDs 5 are disposed in the display area 11 and arranged in an array. Each OLED 5 includes an anode 51 and a cathode 53 disposed opposite to each other, and a light-emitting layer 52 disposed between the anode 51 and the cathode 53. In some examples, the at least one electrostatic protection portion 6 and anodes 51 of the OLEDs 5 are disposed in a same layer.

In some examples, cathodes 53 of the OLEDs 5 are made of a metal material, such as aluminum (Al) or silver (Ag). In some examples, the anodes 51 of the OLEDs 5 are made of an indium tin oxide (abbreviated as ITO) material. In some other examples, an anode 51 of each OLED 5 has a stacked structure made of the ITO material and the metal material, such as a structure formed by ITO layer(s) and silver (Ag) layer(s) stacked on top of one another, or a structure formed by ITO layer(s) and magnesium (Mg) layer(s) stacked on top of one another, so that the anode 51 of the OLED 5 has a more excellent electrical conductivity.

In some embodiments, the cathodes 53 of the OLEDs are coupled to each other to form an electrode layer. In some other embodiments, the cathodes 53 of the OLEDs are spaced apart. In this case, the cathodes 53 of the OLEDs may coupled to a portion via leads. The following embodiments are described by taking the cathodes 53 of the OLEDs being coupled to each other as an example, which can be used as a reference for the cathodes arranged in other manners. Correspondingly, the description "the cathodes of the OLEDs is coupled/connected" refers to "the electrode layer is coupled/connected".

In some embodiments, the description that the at least one electrostatic protection portion 6 and the anodes 51 of the OLEDs 5 are disposed in a same layer described above means that the at least one electrostatic protection portion 6 and the anodes 51 are made of a same material and are formed through a single patterning process.

In addition, a light-emitting layer 52 of each OLED 5 has a single-layer structure or a multilayer structure. The single-layer structure means that the light emitting layer 52 includes a single organic light-emitting layer. The multilayer structure means that the light-emitting layer 52 includes at least two film layers including the organic light-emitting layer and a hole transport layer, or at least three layers including an electron transport layer, the organic light-emitting layer and the hole transport layer.

In some embodiments, as shown in FIGS. 3-9, the array substrate further includes a pixel defining layer 4. The pixel defining layer 4 is disposed at a side of the planarization layer 3 facing away from the base substrate 1, and partially covers the surfaces of the at least one electrostatic protection portion 6 and the anodes 51 of the OLEDs 5. The pixel defining layer 4 includes openings which are in one-to-one correspondence with the anodes 51 of the OLEDs 5. A light-emitting layer 52 of each OLED 5 is disposed in a corresponding opening in the pixel defining layer 4. The cathodes 53 of the OLED 5 are disposed on surfaces of the pixel defining layer 4 and the light-emitting layers 52 facing away from the base substrate 1. In this way, a portion of the pixel defining layer 4 is disposed between an electrostatic protection portion 6 and cathodes 53 of corresponding OLEDs 5, and the pixel defining layer 4 covers the at least one opening 60 of the electrostatic protection portion 6. That is, a portion of the pixel defining layer 4 is filled in the at least one opening 60 of the electrostatic protection portion 6. In some examples, the pixel defining layer 4 is made of the organic resin material.

As shown in FIGS. 2-9, the array substrate may further includes peripheral signal lines, such as at least one cathode wire 7, a plurality of data line leads, a plurality of gate line leads, at least one clock signal line and a power lead, located in the non-display area 12. The array substrate further has a chip on film (COF) encapsulation region 13 disposed beside the non-display area 12.

Figure 4:
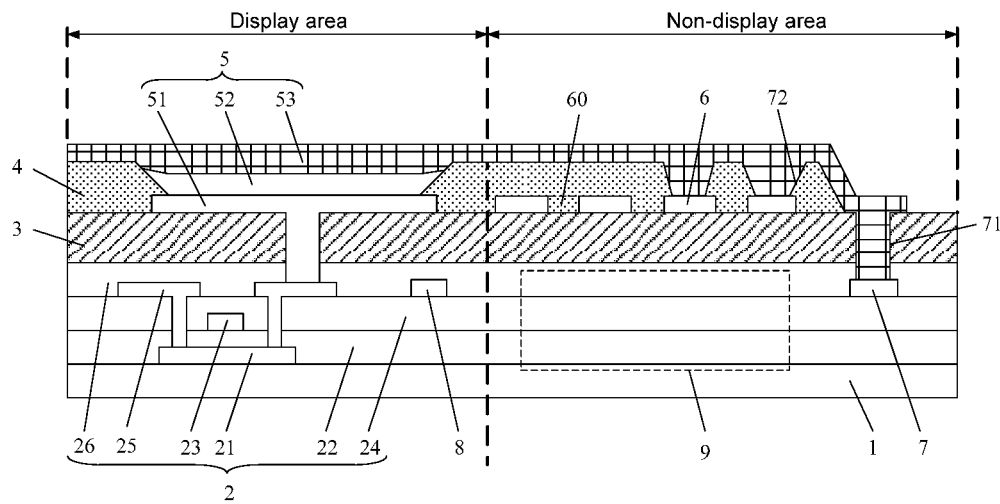
FIG. 4 is a cross-sectional diagram of another array substrate taken along line B-B', in accordance with some embodiments.

In some embodiments, as shown in FIGS. 3-9, the at least one GOA circuit 9 and the at least one cathode wire 7 are disposed at a side of the planarization layer 3 close to the base substrate 1. In some examples, as shown in FIGS. 3 and 4, the cathodes 53 of the OLEDs 5 are directly coupled to the at least one cathode wire 7. In some other examples, as shown in FIGS. 5-9, the cathodes 53 of the OLEDs 5 are coupled to a cathode wire 7 through a corresponding electrostatic protection portion 6.

In some embodiments, with reference to FIGS. 3 and 4, an orthographic projection of the at least one electrostatic protection portion 6 on the base substrate 1 is located outside an orthographic projection of the at least one cathode wire 7 on the base substrate 1, so that the cathodes 53 of the OLEDs 5 may be directly coupled to the at least one cathode wire 7. For example, a portion of the planarization layer 3 directly opposite a cathode wire 7 is provided with at least one first via hole 71, and the cathodes 53 of the OLEDs 5 are directly coupled to the cathode wire 7 through the at least one first via hole 71.

In some examples, with reference to FIG. 4, the pixel defining layer 4 is disposed between the at least one electrostatic protection portion 6 and the cathodes 53 of the OLEDs 5. The orthographic projection of the at least one electrostatic protection portion 6 on the base substrate 1 is located within an outer boundary of the orthographic projection of the pixel defining layer 4 on the base substrate 1, and the orthographic projection of the at least one cathode wire 7 on the base substrate 1 is located outside the outer boundary of the orthographic projection of the pixel defining layer 4 on the base substrate 1. A portion of the pixel defining layer 4 directly opposite an electrostatic protection portion 6 is provided with at least one second via hole 72, and the cathodes 53 of the OLEDs 5 are coupled to the electrostatic protection portion 6 through the at least one second via hole 72.

In some embodiments, as shown in FIGS. 5-9, in a case where the cathodes 53 are coupled to a cathode wire 7 through a corresponding electrostatic protection portion 6, the cathodes 53 are connected to the electrostatic protection portion 6 (i.e., a solid sub-portion of the electrostatic protection portion 6), and an orthographic projection of a portion of the cathodes 53, which is in contact with the electrostatic protection portion 6, on the base substrate 1 is located outside an orthographic projection of the at least one opening 60 of the electrostatic protection portion 6 on the base substrate. In this way, the cathodes 53 of the OLEDs 5 may be prevented from blocking the at least one opening 60 of the electrostatic protection portion 6, thereby preventing the portion of the cathodes 53, which is in contact with the electrostatic protection portion 6, from closing an outgassing path of the planarization layer 3.

Figure 5:
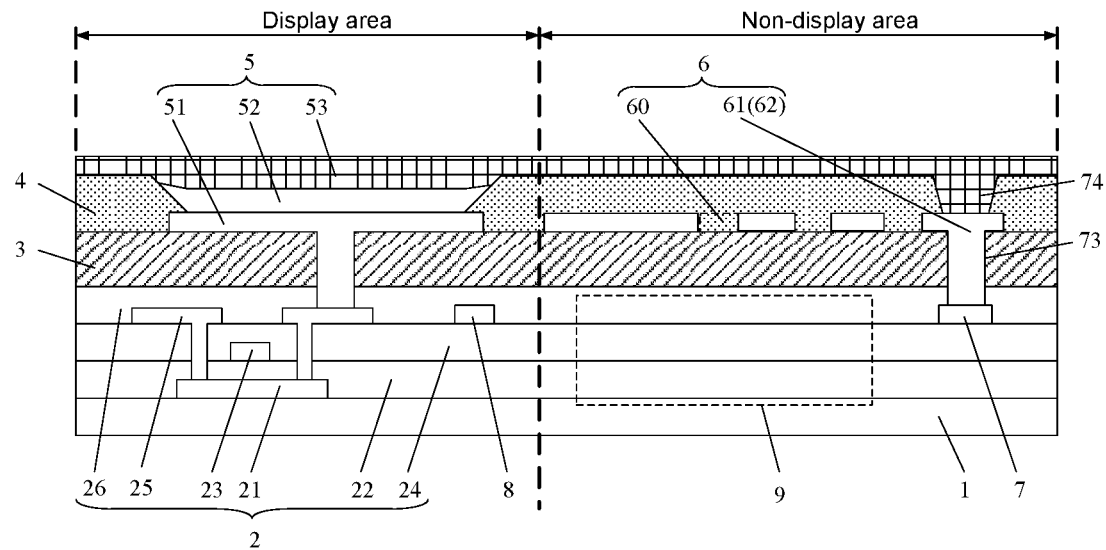
FIG. 5 is a cross-sectional diagram of yet another array substrate taken along line B-B', in accordance with some embodiments.
Figure 6:
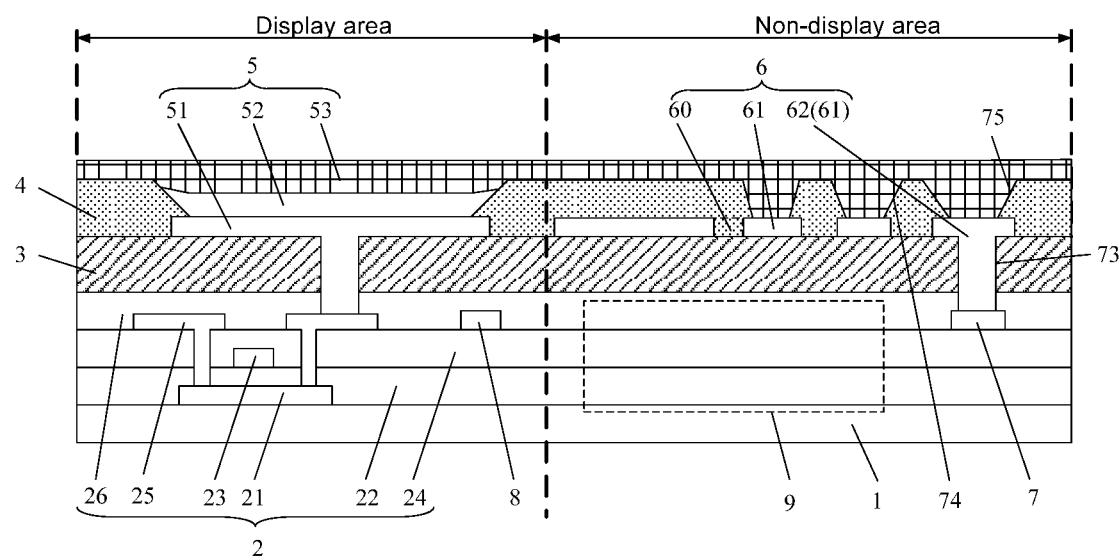
FIG. 6 is a cross-sectional diagram of yet another array substrate taken along line B-B', in accordance with some embodiments.
Figure 7:
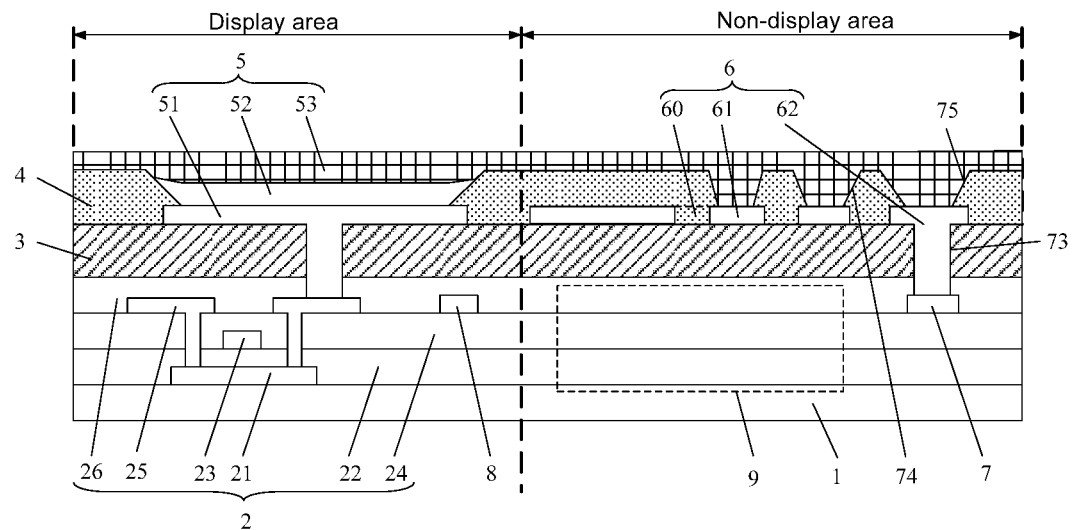
FIG. 7 is a cross-sectional diagram of yet another array substrate taken along line B-B', in accordance with some embodiments.
Figure 8:
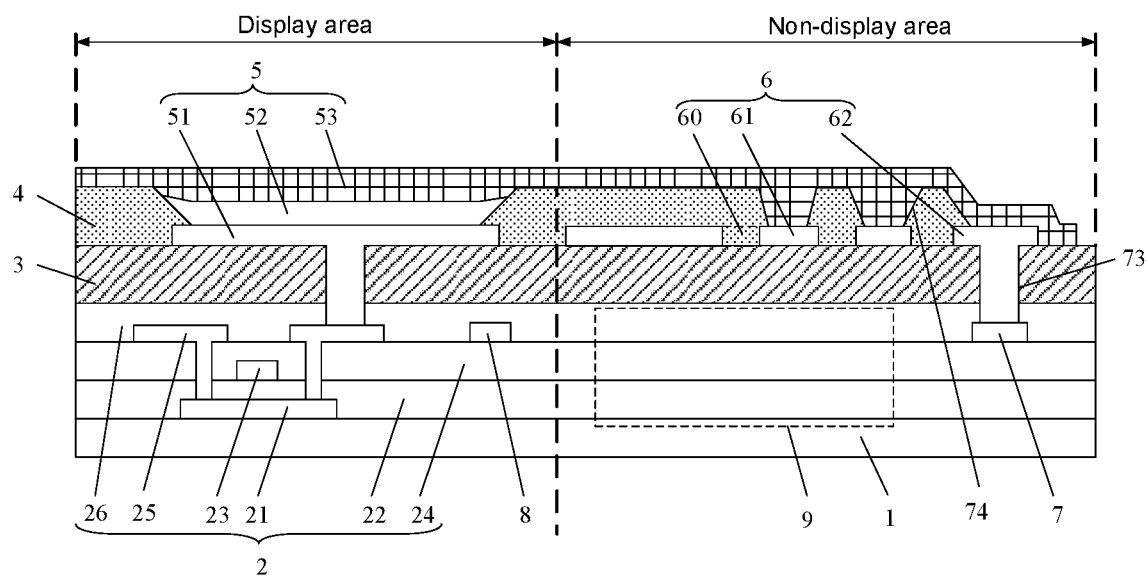
FIG. 8 is a cross-sectional diagram of yet another array substrate taken along line B-B', in accordance with some embodiments.
Figure 9:
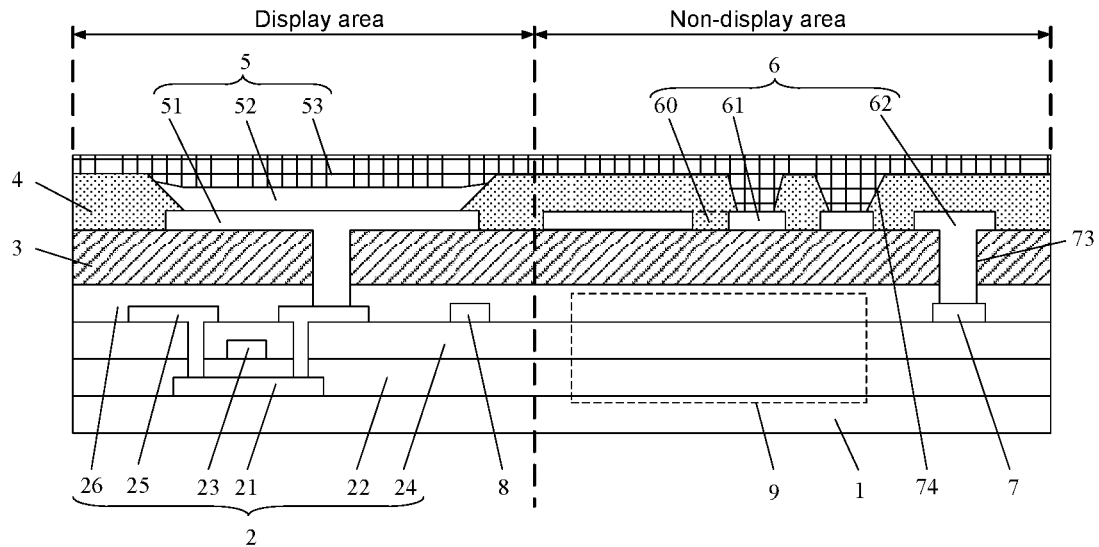
FIG. 9 is a cross-sectional diagram of yet another array substrate taken along line B-B', in accordance with some embodiments.

In some embodiments, in the case where the cathodes 53 of the OLEDs 5 are coupled to a cathode wire 7 through a corresponding electrostatic protection portion 6, with reference to FIGS. 5-8, the electrostatic protection portion 6 includes at least one first connecting portion 61 and at least one second connecting portion 62 connected to the at least one first connecting portion 61. The at least one connecting portion 61 is coupled to the cathodes 53 of the OLEDs 5, and each second connecting portion 62 is coupled to a corresponding cathode wire 7. The at least one first connecting portion 61 and the at least one second connecting portion 62 in the electrostatic protection portion 6 may be set in a plurality of ways according to actual needs. For example, as shown in FIGS. 5 and 6, an orthographic projection of the at least one first connecting portion 61 on the base substrate 1 at least partially coincides with an orthographic projection of the at least one second connecting portion 62 on the base substrate 1. For another example, as shown in FIGS. 7-9, the orthographic projection of the at least one first connecting portion 61 on the base substrate 1 is located outside the orthographic projection of the at least one second connecting portion 62 on the base substrate 1.

Here, the description that an orthographic projection of the at least one first connecting portion 61 on the base substrate 1 at least partially coincides with an orthographic projection of the at least one second connecting portion 62 on the base substrate 1 includes the following situations. In some examples, the orthographic projection of the at least one first connecting portion 61 on the base substrate 1 coincides with or substantially coincides with the orthographic projection of the at least one second connecting portion 62 on the base substrate 1. In some other examples, the orthographic projection of the at least one second connecting portion 62 on the base substrate 1 is located within the orthographic projection of the at least one first connecting portion 61 on the base substrate 1. In some other examples, the orthographic projection of the at least one first connecting portion 61 on the base substrate 1 is located within the orthographic projection of the at least one second connecting portion 62 on the base substrate 1. In some other examples, an orthographic projection of a portion of the at least one first connecting portion 61 on the base substrate 1 coincides with or substantially coincides with an orthographic projection of a portion of the at least one second connecting portion 62 on the base substrate 1.

The relationship of the at least one first connecting portion 61 and the at least one second connecting portion 62 of the electrostatic protection portion 6 is described in details below with examples.

In some examples, with reference to FIG. 5, an orthographic projection of each first connecting portion 61 on the base substrate 1 coincides with an orthographic projection of a corresponding second connecting portion 62 on the base substrate 1. That is, the first connecting portion 61 and the second connecting portion 62 are a same connecting portion. A portion of the planarization layer 3 directly opposite the second connecting portion 62 is provided with at least one third via hole 73, and the second connecting portion 62 is coupled to a corresponding cathode wire 7 through the at least one third via hole 73. A portion of the pixel defining layer 4 directly opposite the first connecting portion 61 is provided with at least one fourth via hole 74, and the cathodes 53 of the OLEDs 5 are coupled to the first connecting portion 61 through the at least one fourth via hole 74.

In some other examples, with reference to FIG. 6, the electrostatic protection portion 6 includes a plurality of first connecting portions 61 and at least one second connecting portion 62. An orthographic projection of each of at least one of the plurality of first connecting portions 61 on the base substrate 1 coincides with an orthographic projection of a corresponding second connecting portion 62 on the base substrate 1, and orthographic projection(s) of remaining first connecting portion(s) 61 on the base substrate 1 is located outside the orthographic projection of the at least one second connecting portion 62 on the base substrate 1. The orthographic projection of the at least one second connecting portion 62 on the base substrate 1 is located within an outer boundary of an orthographic projection of the pixel defining layer 4 on the base substrate 1. A portion of the planarization layer 3 directly opposite each second connecting portion 62 is provided with at least one third via hole 73, and the second connecting portion 62 is coupled to a corresponding cathode wire 7 through the at least one third via hole 73. A portion of the pixel defining layer 4 directly opposite each first connecting portion 61 is provided with at least one fourth via hole 74, and the cathodes 53 of the OLEDs 5 are coupled to the first connecting portion 61 through the at least one fourth via hole 74. A portion of the pixel defining layer 4 directly opposite each second connecting portion 62 is provided with at least one fifth via hole 75, and the cathodes 53 of the OLEDs 5 are also coupled to the second connecting portion 62 through the at least one fifth via hole 75.

The at least one fourth via hole 74 and the at least one fifth via hole 75 described above are a same type of via hole and have a same structure and a same function. A division into the at least one fourth via hole and the at least one fifth via hole is only for clearly explaining connection relationships among different structures in the above embodiments. That is, in the pixel defining layer 4, the via hole corresponding to the first connecting portion 61 is defined as the fourth via hole 74, and the via hole corresponding to the second connecting portion 62 is defined as the fifth via hole 75, other than which there are no other substantive limitations.

In some other embodiments, with reference to FIG. 7, the orthographic projection of the at least one first connecting portion 61 of the electrostatic protection layer 6 on the base substrate 1 is located outside the orthographic projection of the at least one second connecting portion 62 of the electrostatic protection layer 6 on the base substrate 1, and the orthographic projection of the at least one second connecting portion 62 on the base substrate 1 is located within an outer boundary of an orthographic projection of the pixel defining layer 4 on the base substrate 1. A portion of the pixel defining layer 4 directly opposite each second connecting portion 62 is provided with at least one fifth via hole 75, and the cathodes 53 of the OLEDs 5 are coupled to the second connecting portion 62 through the at least one fifth via hole 75.

In some other embodiments, with reference to FIG. 8, the orthographic projection of the at least one first connecting portion 61 of the electrostatic protection portion 6 on the base substrate 1 is located outside the orthographic projection of the at least one second connecting portion 62 on the base substrate 1, and the orthographic projection of the at least one second connecting portion 62 on the base substrate 1 is substantially located outside the orthographic projection of the pixel defining layer 4 on the base substrate 1. The portion of the planarization layer 3 directly opposite each second connecting portion 62 is provided with at least one third via hole 73, and the second connecting portion 62 is coupled to a corresponding cathode wire 7 through the at least one third via hole 73. The portion of the pixel defining layer 4 directly opposite each first connecting portion 61 is provided with at least one fourth via hole 74, and the cathodes 53 of the OLEDs 5 are coupled to the first connecting portion 61 through the at least one fourth via hole 74. The cathodes 53 of the OLEDs 5 are also directly coupled to the at least one second connecting portion 62.

In some other embodiments, with reference to FIG. 9, the orthographic projection of the at least one first connecting portion 61 of the electrostatic protection portion 6 on the base substrate 1 is located outside the orthographic projection of the at least one second connecting portion 62 of the electrostatic protection portion 6 on the base substrate 1. The orthographic projection of the at least one second connecting portion 62 on the base substrate 1 is located within the orthographic projection of the pixel defining layer 4 on the base substrate 1. In some examples, there is a spacing between the orthographic projection of the at least one first connecting portion 61 on the base substrate 1 and the orthographic projection of the at least one second connecting portion 62 on the base substrate 1. The portion of the planarization layer 3 directly opposite each second connecting portion 62 is provided with at least one third via hole 73, and the second connecting portion 62 is coupled to a corresponding cathode wire 7 through the at least one third via hole 73. The portion of the pixel defining layer 4 directly opposite each first connecting portion 61 is provided with at least one fourth via hole 74, and the cathodes 53 of OLEDs 5 are coupled to the first connecting portion 61 through the at least one fourth via hole 74. There is a spacing between an orthographic projection of the at least one fourth via hole 74 on the base substrate 1 and an orthographic projection of the at least one third via hole 73 on the base substrate 1.

In some embodiments, with reference to FIGS. 3-9, the array substrate further includes an active layer 21, a gate insulating layer 22, a gate layer 23, an interlayer insulating layer 24, a source and drain layer 25 and a passivation layer 26 sequentially stacked on a surface of the base substrate 1 close to the planarization layer 3. The planarization layer 3 is disposed on a surface of the passivation layer 26 facing away from the base substrate 1. The array substrate further includes data lines 8 disposed in the display area 11, and the data lines 8 are disposed in the same layer as the source and drain layer 25. In some examples, the at least one cathode wire 7 and the data lines 8 are disposed in the same layer.

That is, the at least one cathode wire 7, the data lines 8 and the source and drain layer 25 are made of the same material and are formed through a single patterning process.

The gate layer 23, the source and drain layer 25, the at least one cathode wire 7 and the data lines 8 described above are, for example, made of one or more of metal materials such as copper (Cu), aluminum (Al), molybdenum (Mo), titanium (Ti), chromium (Cr), and tungsten (W) or alloy materials thereof. For example, each of the gate layer 23, the source and drain layer 25, the at least one cathode wire 7 and the data lines 8 is a single-layer metal wire made of copper. For another example, each of the gate layer 23, the source and drain layer 25, the at least one cathode wire 7 and the data lines 8 is a stacked metal wire made of Mo/Al/Mo. For another example, each of the gate layer 23, the source and drain layer 25, the cathode wire 7 and the data lines 8 is a stacked metal wire made of Ti/Cu/Ti. For another examples, each of the gate layer 23, the source and drain layer 25, the cathode wire 7 and the data lines 8 is a stacked metal wire made of MoTi/Cu.

The active layer 21 is, for example, a semiconductor layer such as an indium gallium zinc oxide (abbreviated as IGZO) layer or a low-temperature polysilicon layer.

The gate insulating layer 22, the interlayer insulating layer 24 and the passivation layer 26 each have a single-layer structure such as a silicon nitride layer or a silicon oxide layer, or each have a multilayer structure such as a stacked structure formed of a silicon nitride layer and a silicon oxide layer.

Figure 10:
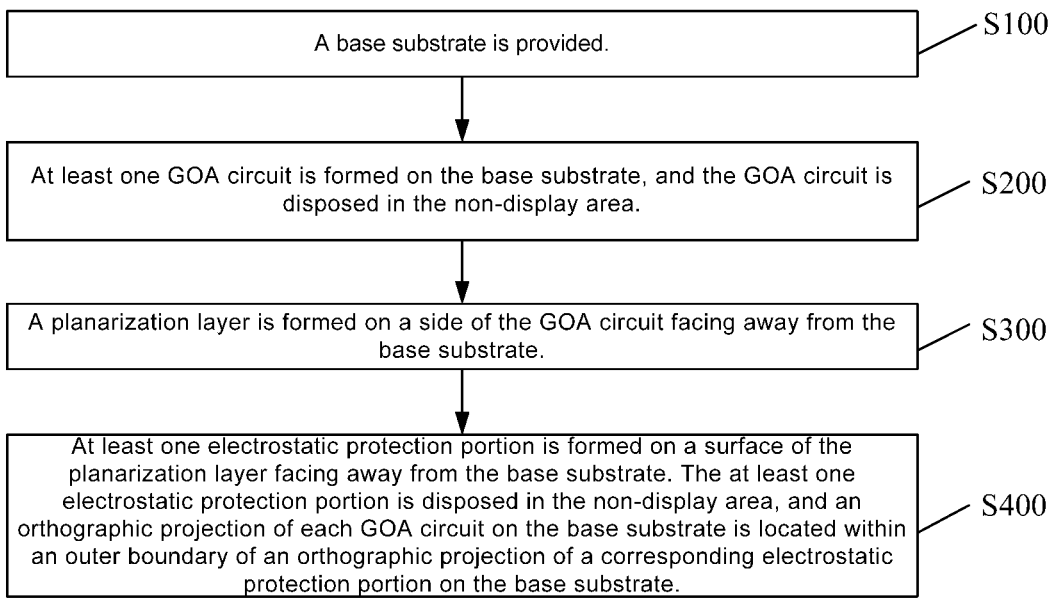
FIG. 10 is a flow diagram of a method of manufacturing an array substrate, in accordance with some embodiments.

Some embodiments of the present disclosure provide a method of manufacturing an array substrate. The array substrate has a display area and a non-display area disposed at a periphery of the display area. With reference to FIG. 10, the method of manufacturing the array substrate includes S100 to S400.

In S100, a base substrate is provided.

In S200, at least one GOA circuit is formed on the base substrate, and the at least one GOA circuit is disposed in the non-display area.

In S300, a planarization layer is formed on a side of the at least one GOA circuit facing away from the base substrate.

In S400, at least one electrostatic protection portion is formed on a surface of the planarization layer facing away from the base substrate. The at least one electrostatic protection portion is disposed in the non-display area, and an orthographic projection of each GOA circuit on the base substrate is located within an outer boundary of an orthographic projection of a corresponding electrostatic protection portion on the base substrate.

The method of manufacturing the array substrate provided by the embodiments of the present disclosure is used for manufacturing the array substrate provided by some embodiments described above, and technical effects that may be achieved are the same as the technical effects of the array substrate described above, which are not described herein again.

In some embodiments, the at least one electrostatic protection portion is made of a conductive metal. The method of manufacturing the array substrate further includes forming at least one opening in each electrostatic protection portion. In this way, the at least one opening may be used to reduce a blocking of gases released from the planarization layer by the electrostatic protection portion to ensure that organic substances that are easily volatilized when heated in the planarization layer are easily volatilized in a drying process or other subsequent processes of manufacturing the array substrate, thereby preventing bubbles from accumulating on a surface of the electrostatic protection portion facing the planarization layer, which is advantageous for ensuring a process yield of the array substrate, thereby ensuring a good display effect of the array substrate.

In some embodiments, the array substrate is an OLED substrate, and the OLED substrate includes OLEDs disposed on a surface of the planarization layer facing away from the base substrate. The OLEDs are disposed in the display area and are arranged in an array. Each OLED 5 includes an anode and a cathode disposed opposite to each other and a light-emitting layer disposed between the anode and the cathode. The at least one electrostatic protection portion described above and the anodes of the OLEDs are usually formed in a same layer.

Figure 11:
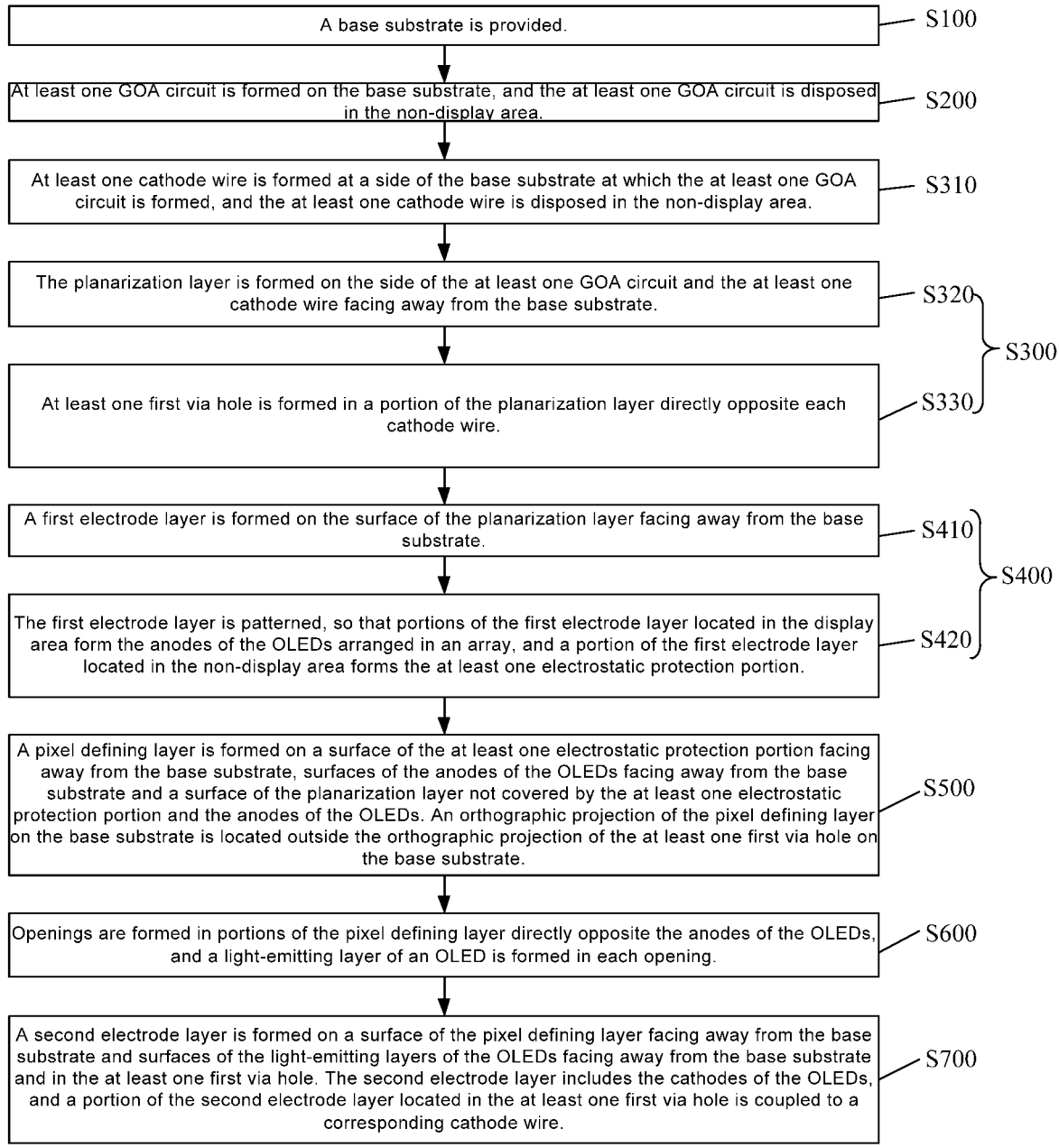
FIG. 11 is a flow diagram of a method of manufacturing another array substrate, in accordance with some embodiments.
Figure 12:
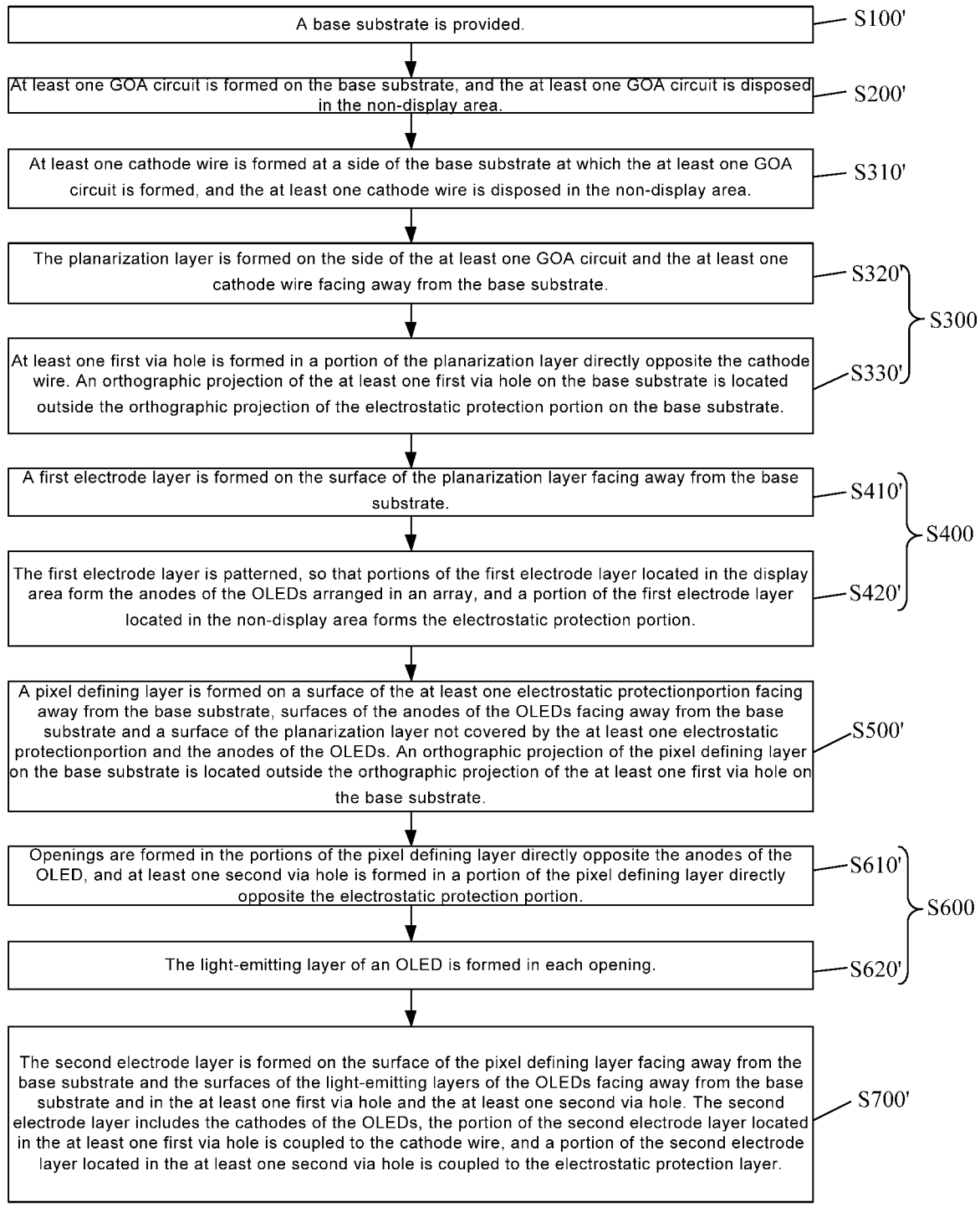
FIG. 12 is a flow diagram of a method of manufacturing yet another array substrate, in accordance with some embodiments.

With reference to FIG. 11, the S400 in the method of manufacturing the array substrate includes S410 to S420.

In S410, a first electrode layer is formed on the surface of the planarization layer facing away from the base substrate.

In S420, the first electrode layer is patterned, so that portions of the first electrode layer located in the display area form the anodes of the OLEDs arranged in an array, and a portion of the first electrode layer located in the non-display area forms the at least one electrostatic protection portion.

In addition, in some embodiments, the array substrate further includes at least one cathode wire located in the non-display area, and the at least one cathode wire is disposed at a side of the planarization layer facing the base substrate.

For example, in a case where the array substrate provided by some embodiments has the structure shown in FIG. 3 or FIG. 4, with reference to FIG. 11, before the S300, the method of manufacturing the array substrate further includes S310.

In S310, the at least one cathode wire 7 is formed at a side of the base substrate 1 at which the at least one GOA circuit 9 is formed, and the at least one cathode wire 7 is disposed in the non-display area.

In this case, the S300 includes S320 and S330.

In S320, the planarization layer 3 is formed on the side of the at least one GOA circuit 9 and the at least one cathode wire 7 facing away from the base substrate 1.

In S330, at least one first via hole 71 is formed in a portion of the planarization layer 3 directly opposite each cathode wire 7.

In some examples, the orthographic projection of the electrostatic protection portion 6 on the base substrate 1 does not overlap with an orthographic projection of the at least one first via hole 71 on the base substrate 1. That is, the orthographic projection of the at least one first via hole 71 on the base substrate 1 is located outside the orthographic projection of the electrostatic protection portion 6 on the base substrate 1, and the cathodes 53 of the OLEDs 5 may be directly coupled to the cathode wire 7.

The array substrate has the structure shown in FIG. 3. With continued reference to FIGS. 11 and 3, the method of manufacturing the array substrate described above further includes S500 to S700.

In S500, a pixel defining layer 4 is formed on a surface of the at least one electrostatic protection portion 6 facing away from the base substrate 1, surfaces of the anodes 51 of the OLEDs 5 facing away from the base substrate 1 and a surface of the planarization layer 3 not covered by the at least one electrostatic protection portion 6 and the anodes 51 of the OLEDs 5. An orthographic projection of the pixel defining layer 4 on the base substrate 1 is located outside the orthographic projection of the at least one first via hole 71 on the base substrate 1.

In S600, openings are formed in portions of the pixel defining layer 4 directly opposite the anodes 51 of the OLEDs 5, and a light-emitting layer 52 of an OLED 5 is formed in each opening.

In S700, a second electrode layer is formed on a surface of the pixel defining layer 4 facing away from the base substrate 1 and surfaces of the light-emitting layers 52 of the OLEDs 5 facing away from the base substrate 1 and in the at least one first via hole 71. The second electrode layer includes the cathodes 53 of the OLEDs 5, and a portion of the second electrode layer located in the at least one first via hole 71 is coupled to the cathode wire 7. That is, the cathodes 53 of the OLEDs 5 are coupled to the cathode wire 7 through the at least one first via hole 71.

In some other examples, the array substrate has the structure shown in FIG. 4. With reference to FIGS. 11 and 4, S600 in the method of manufacturing the array substrate includes S610' to S620'.

In S610', openings are formed in the portions of the pixel defining layer 4 directly opposite the anodes 51 of the OLEDs 5, and at least one second via hole 72 is formed in a portion of the pixel defining layer 4 directly opposite each electrostatic protection portion 6.

In S620', a light-emitting layer 52 of an OLED 5 is formed in each opening of the pixel defining layer 4.

In some embodiments, S700 in the method of manufacturing the array substrate includes: forming the second electrode layer on the surface of the pixel defining layer 4 facing away from the base substrate 1 and the surfaces of the light-emitting layers 52 of the OLEDs 5 facing away from the base substrate 1, and in the at least one first via hole 71 and the at least one second via hole 72. The second electrode layer includes the cathodes 53 of the OLEDs 5, and the portion of the second electrode layer located in the at least one first via hole 71 is coupled to a corresponding cathode wire 7. That is, the cathodes 53 of the OLEDs 5 are coupled to the cathode wire 7 through the at least one first via hole 71. A portion of the second electrode layer located in the at least one second via hole 72 is coupled to a corresponding electrostatic protection portion 6. That is, the cathodes 53 of the OLEDs 5 are coupled to the electrostatic protection portion 6 through the at least one second via hole 72.

Figure 13:
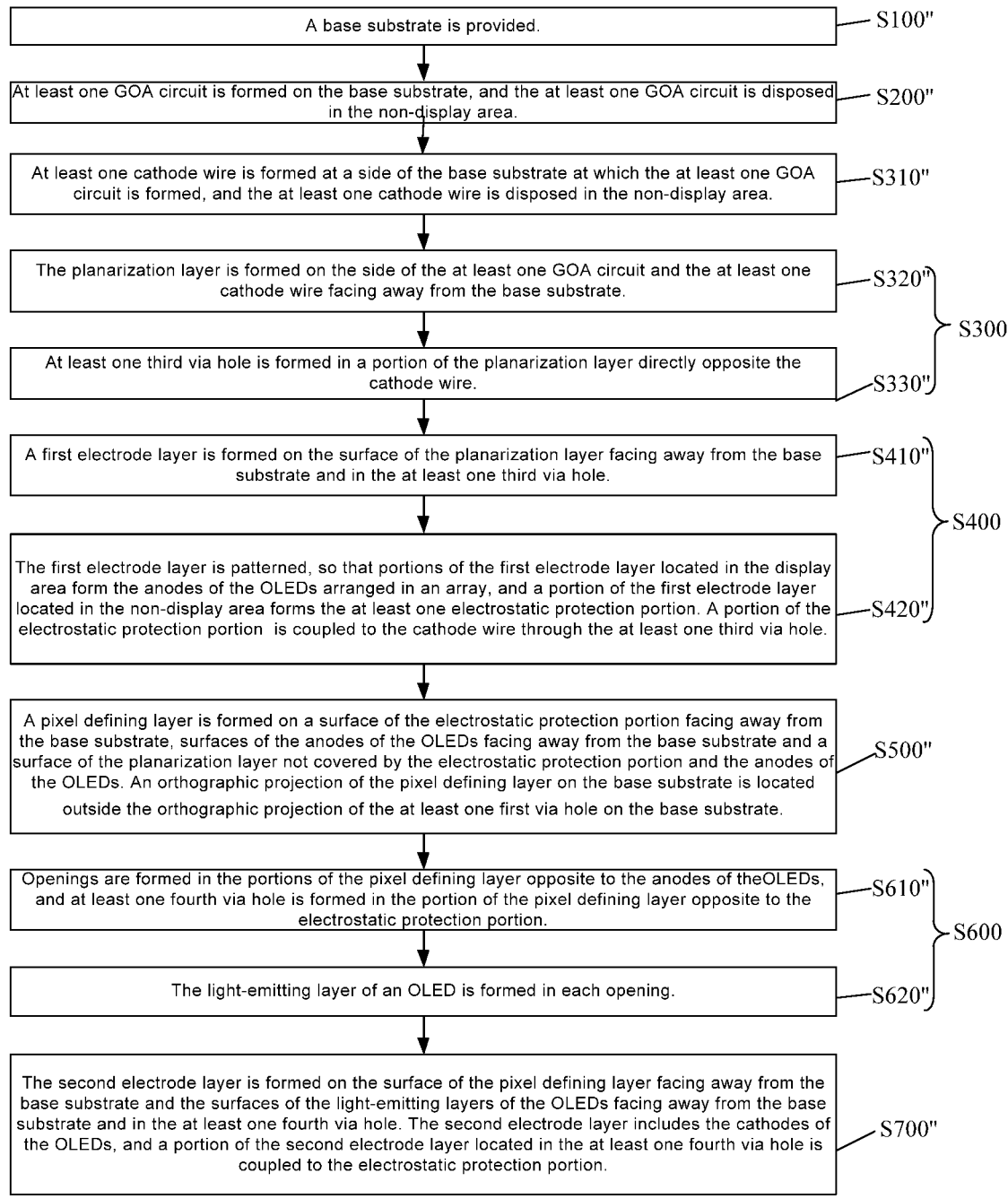
FIG. 13 is a flow diagram of a method of manufacturing yet another array substrate, in accordance with some embodiments.

In some embodiments, the array substrate has the structure shown in FIG. 5, 6, 7, 8 or 9. With reference to FIG. 13, S300 in the method of manufacturing the array substrate includes S310" to S330".

In S310", at least one cathode wire 7 is formed at the side of the base substrate 1 at which the at least one GOA circuit 9 is formed, and the at least one cathode wire 7 is disposed in the non-display area.

In S320", the planarization layer 3 is formed on the side of the at least one GOA circuit 9 and the at least one cathode wire 7 facing away from the base substrate 1.

In S330", at least one third via hole 73 is formed in the portion of the planarization layer 3 directly opposite each cathode wire 7. A portion of the electrostatic protection portion 6 is coupled to the cathode wire 7 through the at least one third via hole 73.

Based on this, the cathodes 53 of the OLEDs 5 in the array substrate are coupled to each cathode wire 7 through a corresponding electrostatic protection portion 6. With continued reference to FIG. 13, S500 to S700 in the method of manufacturing the array substrate are correspondingly as follows.

In S500", the pixel defining layer 4 is formed on the surface of the at least one electrostatic protection portion 6 facing away from the base substrate 1, the surfaces of the anodes 51 of the OLEDs 5 facing away from the base substrate 1 and the surface of the planarization layer 3 not covered by the at least one electrostatic protection portion 6 and the anodes 51 of the OLEDs 5.

In S610", openings are formed in the portions of the pixel defining layer 4 directly opposite the anodes 51 of the OLEDs 5, and at least one fourth via hole 74 is formed in the portion of the pixel defining layer 4 directly opposite each electrostatic protection portion 6.

In S620", a light-emitting layer 52 of an OLED 5 is formed in each opening of the pixel defining layer 4.

In S700", the second electrode layer is formed on the surface of the pixel defining layer 4 facing away from the base substrate 1 and the surfaces of the light-emitting layers 52 of the OLEDs 5 facing away from the base substrate 1, and in the at least one fourth via hole 74. The second electrode layer includes the cathodes 53 of the OLEDs 5, and a portion of the second electrode layer located in the at least one fourth via hole 74 is coupled to the electrostatic protection portion 6. That is, the cathodes 53 of the OLEDs 5 are coupled to the electrostatic protection portion 6 through the at least one fourth via hole 74.

Some embodiments of the present disclosure provide a display panel, which includes the array substrate provided by some embodiments described above. The array substrate in the display panel has same advantages as the array substrate in some embodiments described above, which are not described herein again.

Figure 14:
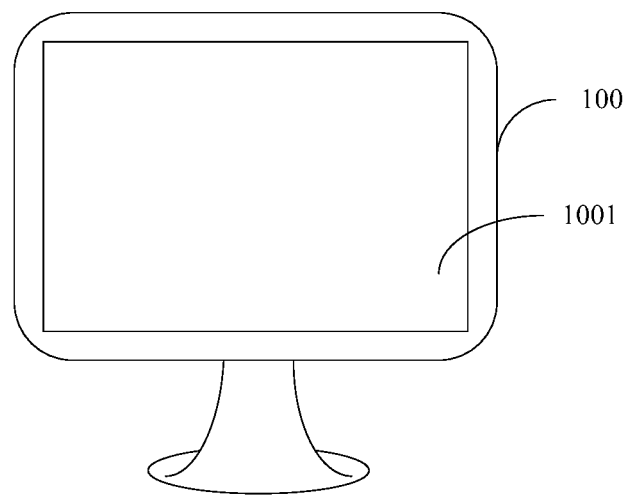
FIG. 14 is a schematic diagram of a display device, in accordance with some embodiments.

Some embodiments of the present disclosure provide a display device. With reference to FIG. 14, the display device 100 includes the display panel 1001 provided by some embodiments described above. The display panel in the display device has the same advantages as the display panel in some embodiments described above, which are not described herein again.

The display device provided by some embodiments described above is a product or component having a display function, such as a mobile phone, a tablet computer, a television, a display, a notebook computer, a digital photo frame or a navigator.

In the description of the above embodiments, specific features, structures, materials or characteristics may be combined in any suitable manner in any one or more embodiments or examples.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. An array substrate, having a display area and a non-display area disposed at a periphery of the display area, the array substrate comprising:
a base substrate;
at least one gate driver on array (GOA) circuit disposed on the base substrate, wherein the at least one GOA circuit is disposed in the non-display area;
a planarization layer disposed on a side of the at least one GOA circuit facing away from the base substrate;
at least one electrostatic protection portion disposed on a surface of the planarization layer facing away from the base substrate, wherein the at least one electrostatic protection portion is disposed in the non-display area;
organic light-emitting diodes (OLEDs) disposed on the surface of the planarization layer facing away from the base substrate; and
at least one cathode wire disposed at a side of the planarization layer close to the base substrate, the at least one cathode wire being disposed in the non-display area, wherein an orthographic projection of each GOA circuit on the base substrate is located within an outer boundary of an orthographic projection of a corresponding electrostatic protection portion on the base substrate;
the OLEDs are disposed in the display area and are arranged in an array, and each OLED includes:
an anode and a cathode disposed opposite to each other; and
a light-emitting layer disposed between the anode and the cathode, wherein
the at least one electrostatic protection portion and anodes of the OLEDs are disposed in a same layer;
cathodes of the OLEDs are coupled to each cathode wire through a corresponding electrostatic protection portion;
each electrostatic protection portion includes at least one opening, and an orthographic projection of the at least one GOA circuit on the base substrate overlaps with an orthographic projection of the at least one opening on the base substrate;
the cathodes of the OLEDs are coupled to the electrostatic protection portion, and an orthographic projection of a portion of the cathodes, which is in contact with the electrostatic protection portion, on the base substrate is located outside an orthographic projection of the at least one opening on the base substrate;
the electrostatic protection portion includes at least one first connecting portion and at least one second connecting portion connected to the at least one first connecting portion, the at least one first connecting portion is coupled to the cathodes of the OLEDs, each second connecting portion is coupled to a corresponding cathode wire, and an outer boundary of an orthographic projection of a side of the second connecting portion away from the display area on the base substrate is located outside an outer boundary of an orthographic projection of a side of the corresponding cathode wire away from the display area on the base substrate;
the array substrate further comprises a pixel defining layer disposed between the at least one electrostatic protection portion and the cathodes of the OLEDs;
a portion of the pixel defining layer directly opposite each first connecting portion is provided with at least one fourth via hole, and the cathodes of the OLEDs are coupled to the first connecting portion through the at least one fourth via hole;
an orthographic projection of the at least one first connecting portion on the base substrate is located outside an orthographic projection of the at least one second connecting portion on the base substrate, the orthographic projection of the at least one second connecting portion on the base substrate is located within an outer boundary of an orthographic projection of the pixel defining layer on the base substrate, and a portion of the pixel defining layer directly opposite each second connecting portion is provided with at least one fifth via hole; and the cathodes of the OLEDs are also coupled to the second connecting portion through the at least one fifth via hole.

2. The array substrate according to claim 1, wherein a portion of the planarization layer directly opposite each second connecting portion is provided with at least one third via hole, and the second connecting portion is coupled to a corresponding cathode wire through the at least one third via hole.

3. A method of manufacturing the array substrate according to claim 1, the array substrate having the display area and the non-display area disposed at the periphery of the display area, the method comprising:

providing the base substrate;

forming the at least one gate driver on array (GOA) circuit on the base substrate, wherein the at least one GOA circuit is disposed in the non-display area;

forming the at least one cathode wire at the side of the base substrate at which the at least one GOA circuit is formed, the at least one cathode wire being disposed in the non-display area;

forming the planarization layer on the side of the at least one GOA circuit and at least one cathode wire facing away from the base substrate;

forming the at least one electrostatic protection portion on the surface of the planarization layer facing away from the base substrate, wherein the orthographic projection of the GOA circuit on the base substrate is located within the outer boundary of the orthographic projection of the corresponding electrostatic protection portion on the base substrate; and forming the at least one opening in each electrostatic protection portion, wherein the orthographic projection of the at least one GOA circuit on the base substrate overlaps with the orthographic projection of the at least one opening on the base substrate;

wherein forming the at least one electrostatic protection portion on the surface of the planarization layer facing away from the base substrate, includes:

forming a first electrode layer on the surface of the planarization layer facing away from the base substrate; and patterning the first electrode layer, so that portions of the first electrode layer located in the display area form the anodes of the OLEDs arranged in the array, and a portion of the first electrode layer located in the non-display area forms the at least one electrostatic protection portion, wherein the electrostatic protection portion includes the at least one first connecting portion and the at least one second connecting portion connected to the at least one first connecting portion, the at least one first connecting portion is coupled to the cathodes of the OLEDs, each second connecting portion is coupled to the corresponding cathode wire, and the outer boundary of the orthographic projection of the side of the second connecting portion away from the display area on the base substrate is located outside the outer boundary of the orthographic projection of the side of the corresponding cathode wire away from the display area on the base substrate;

wherein the method of manufacturing the array substrate further comprises:

forming the pixel defining layer on a surface of the at least one electrostatic protection portion facing away from the base substrate, surfaces of the anodes of the OLEDs facing away from the base substrate and a surface of the planarization layer not covered by the at least one electrostatic protection portion and the anodes of the OLEDs;

forming openings in portions of the pixel defining layer directly opposite the anodes of the OLEDs respectively, and forming the at least one fourth via hole in the portion of the pixel defining layer directly opposite each electrostatic protection portion;

forming the light-emitting layer of an OLED in each opening; and forming a second electrode layer on a surface of the pixel defining layer facing away from the base substrate and surfaces of light-emitting layers of the OLEDs facing away from the base substrate and in the at least one fourth via hole, wherein the second electrode layer includes the cathodes of the OLEDs, and a portion of the second electrode layer located in the at least one fourth via hole is coupled to the electrostatic protection portion.

4. The method of manufacturing the array substrate according to claim 3, wherein forming the planarization layer on a side of the at least one GOA circuit and the at least one cathode wire facing away from the base substrate, includes:

forming at least one third via hole in a portion of the planarization layer directly opposite each cathode wire, wherein a portion of the electrostatic protection portion is coupled to the cathode wire through the at least one third via hole.

5. A display panel, comprising the array substrate according to claim 1.

6. A display device, comprising the display panel according to claim 5.

* * * * *